United States Patent [19]

Nonaka et al.

[11] 4,445,131
[45] Apr. 24, 1984

[54] PHOTOCONDUCTIVE IMAGE PICK-UP TUBE TARGET

[75] Inventors: Yasuhiko Nonaka, Mobara; Keiichi Shidara, Tama; Naohiro Goto, Machida, all of Japan

[73] Assignees: Hitachi, Ltd.; Nippon Hoso Kyokai, both of Tokyo, Japan

[21] Appl. No.: 319,796

[22] Filed: Nov. 9, 1981

[30] Foreign Application Priority Data

Nov. 10, 1980 [JP] Japan ............................... 55-157086

[51] Int. Cl.³ .............................................. H01L 27/14
[52] U.S. Cl. ........................................ 357/31; 357/30; 357/90
[58] Field of Search .............................. 357/31, 30, 90

[56] References Cited

U.S. PATENT DOCUMENTS 3,800,194  3/1974  Maruyama et al. .................. 357/31
4,007,473  2/1977  Nonaka et al. ...................... 357/31

FOREIGN PATENT DOCUMENTS 52-63090  5/1977  Japan ................................. 357/31

Primary Examiner—Martin H. Edlow
Assistant Examiner—W. Mintel
Attorney, Agent, or Firm—Charles E. Pfund

[57] ABSTRACT

A photoconductive image pick-up tube target comprising an N-type semiconductor film formed on a transparent substrate, and a P-type photoconductive film in rectifying contact with the N-type semiconductor film and containing Se and As and also Te as sensitizers. A layer of said P-type photoconductive film between the N-type semiconductor film and a Te-containing layer of the P-type photoconductive film has an As concentration distribution which is lower on the side of the N-type conductive film and higher on the side of the Te-containing layer.

2 Claims, 5 Drawing Figures

PHOTOCONDUCTIVE IMAGE PICK-UP TUBE TARGET

BACKGROUND OF THE INVENTION

This invention relates to photoconductive image pick-up tube targets and, more particularly, to a heat-resistant structure of the photoconductive layer. More specifically, the invention concerns a photoconductive image pick-up tube target which can prevent deterioration of the sensitivity characteristic in use at high temperatures.

Recently, a new photoconductive image pick-up tube target of a rectifying contact type, in which a rectifying contact is formed between a P-type photoconductive film containing amorphous selenium (Se), arsenic (As), tellurium (Te), etc. and an N-type semiconductor film, has been proposed as disclosed in Japanese Patent Preliminary Publication No. 24619/1974 and Japanese Patent Application No. 45198/1975. This type of image pick-up tube target has such advantages as minimal residual image and flare, high resolution, minimal white dot image defect and simple manufacture and has a construction as will be described below. As shown in FIG. 1, it includes a disc-like glass plate 1 made of transparent glass, a transparent electrode 2a formed on the base plate 1 and mainly composed of an oxide of an element selected from a group consisting of tin, indium and titanium, and a very thin N-type semiconductor film 2b formed on the transparent electrode 2a and made of a material selected from ZnSe, GeO and $CeO_2$. The transparent electrode 2a and N-type semiconductor film 2b form a transparent semiconductor film 2. A P-type photoconductive film 3 includes a first layer 3a of a thickness of about 300 Å formed on the transparent semiconductor film 2 in rectifying contact therewith and containing 95% by weight of Se and 5% by weight of As as shown in region A in FIG. 2, and a second layer 3b of a thickness of about 600 Å formed on the first layer 3a and containing 65% by weight of Se, 5% by weight of As and 30% by weight of Te as shown in region B in FIG. 2. The second layer 3b serves as a sensitizer layer in which Te concentration sharply rises at a film thickness of about 300 Å, i.e., the termination of the first layer 3a and sharply falls down at a film thickness of about 900 Å. Concentration of As is the same over a thickness of about 900 Å covering the first and second layers 3a and 3b to increase thermal stability of Se. The P-type photoconductive film 3 further includes a third layer 3c formed on the second layer 3b to a thickness of about 600 Å and containing Se varying in concentration from 70% by weight to 100% by weight and As varying in concentration from 30% by weight to 0% by weight as shown in region C in FIG. 2. Since the third layer 3c contains As whose concentration gradient varies linearly from lower to higher over a thickness of about 600 Å, it can enhance the sensitizing effect of the second layer 3b and further increase the thermal stability of Se. Further, a semiconductor film 4 of $Sb_2S_3$ is vapor deposited on the P-type photoconductive film 3 to a thickness of about 1,000 Å, and serves to assist the landing of scanning beams. Incident light 5 is irradiated from the side of the glass plate 1, while a scanning electron beam 6 is applied to the semiconductor film 4.

With the image pick-up target having the above construction, the objective of increasing the sensitivity with respect to long wavelength light can be attained, and properties generally required for the image pick-up tube such as residual image and high-light sticking can be satisfied.

However, while the image pick-up target of the construction provides satsifactory performance under normal working conditions, the sensitivity characteristic with respect to long wavelength light is extremely degraded when the ambient temperature is greatly increased from the ordinary working temperature.

SUMMARY OF THE INVENTION

Accordingly, an object of the invention is to provide a photoconductive image pick-up tube target which can improve thermal-proof properties and prevent ambient-temperature-rise dependent deterioration of the sensitivity characteristic with respect to long wavelength light.

According to the invention, the above object can be accomplished by providing a larger As concentration in a rear half of the first layer of the P-type photoconductive film than that in a front half of the first layer.

DESCRIPTION OF PREFERRED EMBODIMENT

Figure 1:
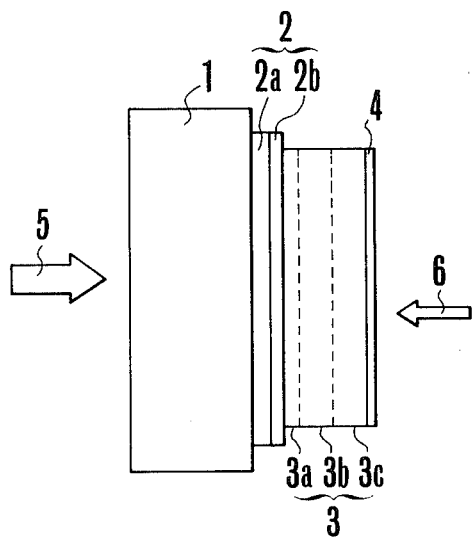
FIG. 1 is a fragmentary sectional view showing a prior art example of a photoconductive image pick-up tube target.
Figure 2:
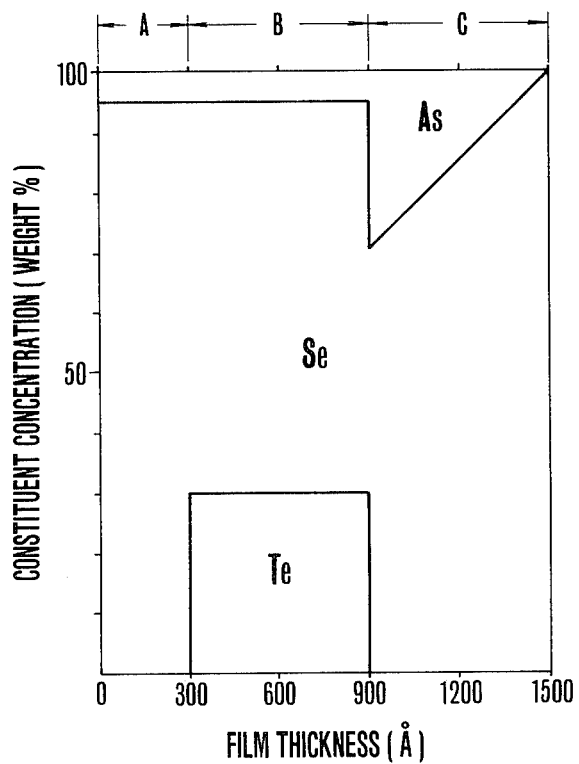
FIG. 2 is a diagram showing the constituent concentration distribution in an essential portion of the target shown in FIG. 1.
Figure 3:
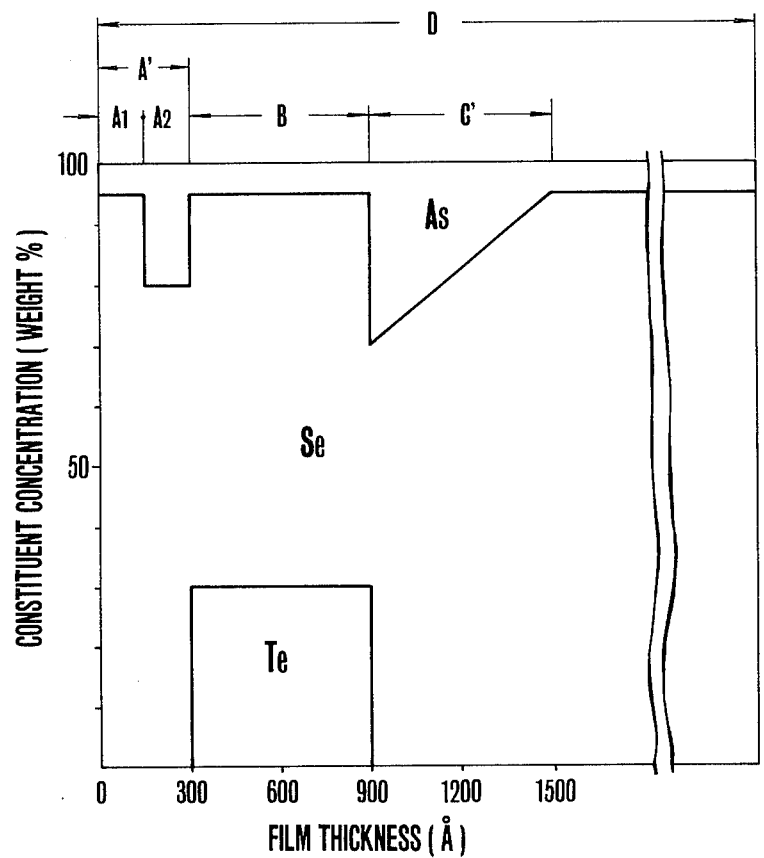
FIG. 3 is a diagram showing the constituent concentration distribution in an essential portion of a photoconductive image pick-up tube target according to the invention.

FIG. 3 shows a constituent distribution diagram for explaining an embodiment of a photoconductive image pick-up tube target according to the invention. In FIG. 3, in place of the region A in FIG. 2, a region A' is formed on the transparent semiconductor film 2 (FIG. 1), constituting a first layer, like the first layer 3a in FIG. 1, in a P-type photoconductive film according to the invention. In this region A', a layer A1, containing 95% by weight of Se and 5% by weight of As, is formed to a thickness of about 150 Å. A' further includes a layer A2 containing 80% by weight of Se and 20% by weight of As, that adds a further thickness of about 150 Å onto the layer A1. the total thickness of 300 Å. In other words, the first layer of the P-type photoconductive film in rectifying contact with the N-type transparent semiconductor film is constituted by a front half layer having a lower As concentration (or 5% by weight) and a rear half layer having a sharply increased As concentration (of 20% by weight), these halves being laminated one over another on the N-type transparent semiconductor film. A second layer of the P-type photoconductive film, like the second layer 3b in FIG. 1, is formed entirely in the same manner as in the prior art. And, in place of the region C of FIG. 2, a region C' is formed on the second layer of the P-type photoconductive film. In this region C', a third layer containing Se in a concentration distribution ranging from 70% by weight to 95% by weight and As in a concentration distribution ranging from 30% by weight to 5% by weight is formed to a thickness of about 600 Å. Further, as is well known in the art, a fourth layer containing 95% by weight of Se and 5% by weight of As is formed uniformly on the third layer such that the total thickness D of the P-type photoconductive film is 4 microns.

Now, a method of manufacture of the photoconductive image pick-up target according to the invention will be described.

A transparent conductive film mainly containing tin oxide is formed on a glass structure, and then $CeO_2$ is vapor deposited as a rectifying contact assistant layer to a thickness of about 300 Å in a vacuum of $3 \times 10^{-6}$ Torr. Subsequently, Se and $As_2Se_3$ are simultaneously vapor deposited from separate vapor deposition boats to form a front half layer of the first layer to a thickness of about 150 Å. At this time, the concentration of As is set to be uniform at 3% by weight in the film thickness direction. Then, a rear half layer of the first layer is vapor deposited uniformly in the film thickness direction with the concentration of As controlled to 20% by weight by varying the current in the vapor deposition boat. Thereafter, the second layer is formed to a thickness of about 600 Å on the first layer by simultaneously vapor depositing Se, $As_2Se_3$ and Te from separate vapor deposition boats. At this time, the concentrations of As and Te are set uniformly, respectively at 5% by weight, and 30% by weight in the film thickness direction. Next, the third layer containing Se and As is formed on the second layer. When vapor depositing the third layer, Se and $As_2Se_3$ are simultaneously vapor deposited from separate vapor deposition boats. At this time, current in the boat for $As_2Se_3$ is controlled such that the concentration of As is linearly changed as the deposition proceeds from the initial 30% by weight to the final 5% by weight over a thickness of about 600 Å. Then, the fourth layer containing Se and As is vapor deposited on the third layer such that the total thickness D of the P-type photoconductive film is about 4 microns. The concentration of As for the fourth layer is set uniformly at 5% by weight. The vapor deposition on the first to fourth layers is carried out in a vacuum of $2 \times 10^{-6}$ Torr. Finally, a semiconductor film 4 (FIG. 1) of $Sb_2S_3$ is vapor deposited as a beam landing assistant film to a thickness of about 1,000 Å on the fourth layer in an argon atmosphere of $2 \times 10^{-1}$ Torr.

With the photoconductive image pick-up tube target of the above construction, a highly viscous layer is formed by the high As concentration layer formed right under the second layer of P-type photoconductive film and prevents the thermal diffusion of Te in the target placed in high temperature atmosphere. Thus, it is possible to improve the thermal resistance of the sensitivity characteristic with respect to long wavelength light in cases when the ambient temperature is increased above the normal operating temperature.

Figure 4:
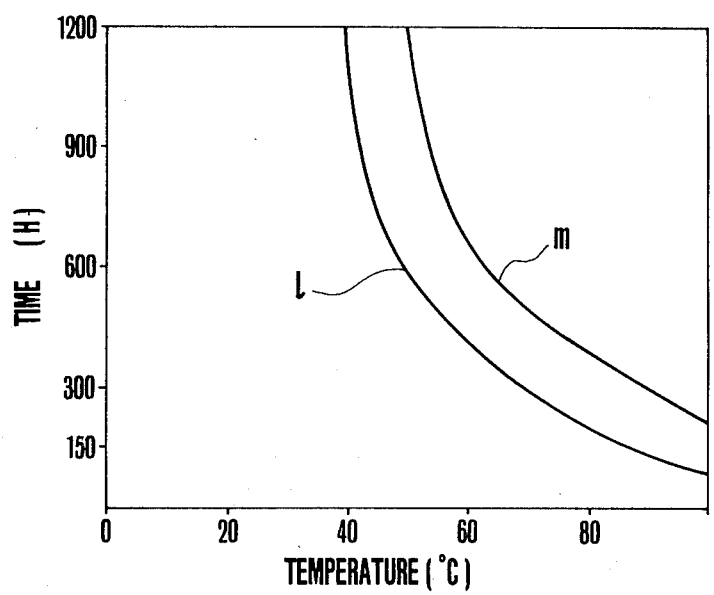
FIG. 4 is a graph showing heat-proof characteristics.
Figure 5:
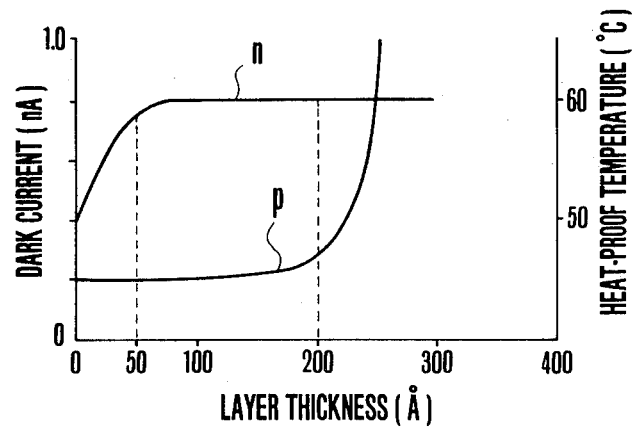
FIG. 5 is a graph showing the relation between thickness of a high concentration As doped half layer and dark current and heat-proof temperature.

FIG. 4 is a graph of time H for sensitivity deterioration with respect to long wavelength light plotted against variations in ambient temperature. Plottings have been made for photoconductive image pick-up targets of the prior art and those made according to the invention. In FIG. 4, the ordinate is taken for the time H for sensitivity deterioration and the abscissa is taken for the ambient temperature at which the target is held. Curve L represents the characteristic of the prior art target, and curve m represents the improved characteristic obtained according to the invention. The effect according to the invention is less pronounced when the thickness of the half layer containing a high concentration of As is insufficient. On the other hand, if the half layer thickness is excessive, the rectifying property is prone to deterioration. The preferable thickness range becomes 50 to 200 Å as shown in FIG. 5. In FIG. 5, the ordinate is taken for dark current (curve p) and heat-proof temperature (curve n), and the abscissa is taken for layer thickness.

Photoconductive image pick-up tube targets having a structure, in which a dark current prevention layer typically made of an N-type oxide consisting of cerium oxide is provided between the N-type semiconductor film and P-type photoconductive film, are essentially the same in the target operation as the target disclosed above and of course fall in the scope of the invention as well.

As has been described in the foregoing, with the photoconductive image pick-up tube target according to the invention, it is possible to improve the target thermal resistance and prevent deterioration of the sensitivity characteristic with respect to long wavelength light, thus permitting great improvement in reliability.

What is claimed is:

1. In a photoconductive image pick-up tube target comprising an N-type semiconductor film formed on a transparent substrate, and a P-type photoconductive film in rectifying contact with said N-type semiconductor film and containing Se and As and also Te as sensitizers the improvement wherein said P-type photoconductive film includes a front layer, a Te-containing layer and a rear layer between said front layer and said Te-containing layer, said front layer being located between said N-type semiconductor film and said rear layer and wherein said rear layer has an As concentration distribution which is greater than the As concentration in said front layer.

2. A photoconductive image pick-up tube target according to claim 1, wherein said rear layer has a thickness of 50 to 200 Å.

* * * * *